United States Patent [19]
Brillhart

[11] Patent Number: 4,503,344
[45] Date of Patent: Mar. 5, 1985

[54] POWER UP RESET PULSE GENERATOR

[75] Inventor: Bruce A. Brillhart, Minneapolis, Minn.

[73] Assignee: Honeywell Inc., Minneapolis, Minn.

[21] Appl. No.: 366,906

[22] Filed: Apr. 9, 1982

[51] Int. Cl.³ .................... H03K 5/153; H03K 17/16; H03K 17/20; H03K 17/687

[52] U.S. Cl. .................................. 307/594; 307/597; 307/362; 307/585

[58] Field of Search ............... 307/591, 592, 595, 596, 307/594, 597, 584, 585, 362, 268, 296 R, 200 B, 450; 340/636, 663

[56] References Cited

U.S. PATENT DOCUMENTS

| 4,103,187 | 7/1978 | Imamura | 307/585 |
|---|---|---|---|
| 4,247,917 | 1/1981 | Tsang et al. | 307/450 X |
| 4,385,245 | 5/1983 | Ulmer | 307/585 X |
| 4,405,871 | 9/1983 | Buurma et al. | 307/594 |

FOREIGN PATENT DOCUMENTS

| 57-4615 | 1/1982 | Japan | 307/584 |
|---|---|---|---|
| 57-4616 | 1/1982 | Japan | 307/584 |
| 183125 | 11/1982 | Japan | 307/585 |

OTHER PUBLICATIONS

Mead et al., *Introduction to VLSI Systems*, pp. 221–228, Oct. 1980.

Primary Examiner—Larry N. Anagnos
Assistant Examiner—David R. Bertelson
Attorney, Agent, or Firm—Theodore F. Neils; David R. Fairbairn

[57] ABSTRACT

A power up reset pulse generator circuit provides a reset pulse to initialize the states of logic elements in a low power field effect transistor (FET) integrated circuit. The reset pulse generator includes a pair of P-channel enhancement FETs and a first capacitor connected in a series charging path between $V_{DD}$ and $V_{SS}$ power supply terminals of the integrated circuit. A second capacitor, and a pair of N-channel enhancement FETs are connected in a second series charging path between the $V_{DD}$ and $V_{SS}$ terminals. The second capacitor is connected between the $V_{DD}$ terminal and an output node, at which the reset pulse is provided. Before power is applied, the first and second capacitors are uncharged and all four FETs are off. When power is applied and the potential between $V_{DD}$ and $V_{SS}$ terminals exceeds twice the P-channel threshold voltage, the P-channel FETs turn on, thereby allowing the first capacitor to begin charging. In the meantime, the voltage at the output has followed $V_{DD}$, since the N-channel FETs remain off. When the voltage across the first capacitor exceeds twice the N-channel threshold voltage, the N-channel FETs turn on, thereby allowing the second capacitor to charge and the potential at the output terminal to move toward the potential of the $V_{SS}$ terminal. After the initial reset pulse is generated, the first and second capacitors are charged to approximately the potential between the $V_{DD}$ and $V_{SS}$ terminals, and the circuit consumes no static power.

13 Claims, 3 Drawing Figures

POWER UP RESET PULSE GENERATOR

BACKGROUND OF THE INVENTION

1. Field of the Invention

The present invention relates to integrated circuits. In particular, the present invention is an integrable power up reset pulse generator for producing a reset pulse to logic elements of a FET integrated circuit when power is initially applied to the integrated circuit.

2. Description of the Prior Art

In digital integrated circuits, it is sometimes desirable to initialize the circuit to a known state when power is first applied to the integrated circuit (i.e. "power up"). This ensures proper initialization of the operating state of the logic elements of the circuit, and also simplifies test procedures. By starting the logic elements of the circuit in a known state, a predetermined set of electrical instructions can be used so that the circuit reaches the desired operating condition.

In the past, various capacitor and transistor time constant circuits have been used to generate a reset pulse upon power up. This reset pulse is applied to the appropriate logic elements to initialize the integrated circuit in a known state.

With CMOS integrated circuits, low power consumption is an important feature. To be useful in conjunction with the CMOS integrated circuit, a power up reset pulse generator circuit must consume very little power both during initial power up, and particularly after the power is reached its static state.

SUMMARY OF THE INVENTION

The present invention is a power up reset pulse generator which is useful with FET integrated circuits (such as CMOS integrated circuits) which feature low power consumption. The reset pulse generator of the present invention produces a reset pulse at an output in response to voltage initially being applied between first and second power supply terminals of the integrated circuit. This reset pulse is used to initialize logic elements of the integrated circuit to a known initial state.

The power up reset pulse generator includes first capacitor means and first FET means connected in a first series charging path between the first and second power supply terminals. The first FET means controls charging of the first capacitor means as a function of the voltage between first and second power supply terminals. In particular, the first FET means permits charging of the first capacitor means when the voltage between the first and second power supply terminals exceeds a first predetermined level.

The reset pulse generator further includes second capacitor means and second FET means connected in a second series charging path between the first and second power supply terminals. The second capacitor means is connected between the first power supply terminal and the output, so that the voltage at the output is a function of the charge on the second capacitor means and the voltage at the first power supply terminal. The second FET means controls charging of the second capacitor means as a function of the voltage across the first capacitor means. When the voltage across the first capacitor means exceeds a second predetermined level, the second FET means permits charging of the second capacitor means.

When voltage is initially applied between the first and second power supply terminals, the voltage at the output of the power up reset pulse generator follows the voltage at the first power supply terminal until the first capacitor means has charged to the second predetermined level. The second FET means then allows the second capacitor means to begin charging, and the voltage at the output moves toward the potential of the second power supply terminal. Once static conditions have been attained with power on, the power up reset pulse generator consumes no static power, since the first and second capacitor means are essentially fully charged and the first and second FET means are nonconducting. The power up reset pulse generator, therefore, produces a single reset pulse upon initial power up, and thereafter remains in an inactive mode without consuming further power.

Depending upon the normal potential difference between the first and second power supply terminals when power is fully on, the first and second FET means may include a plurality of field effect transistors connected in the first and second series charging paths, respectively, so that their threshold voltages are additive. This allows the voltage levels required to turn on the first and second FET means, respectively, to be selected so that a reset pulse of the desired duration is produced. Additional capacitor means are also preferably provided to ensure that the first and second FET means are initially off when power is turned on, and to provide a time delay for turning on the first and second FET means.

The power up reset pulse generator of the present invention is preferably formed in the same integrated circuit chip as the circuitry to which it provides the reset pulse. All components, including the first and second FET means and the first and second capacitor means, are integrated circuit elements.

DETAILED DESCRIPTION OF THE PREFERRED EMBODIMENTS

Figure 1:
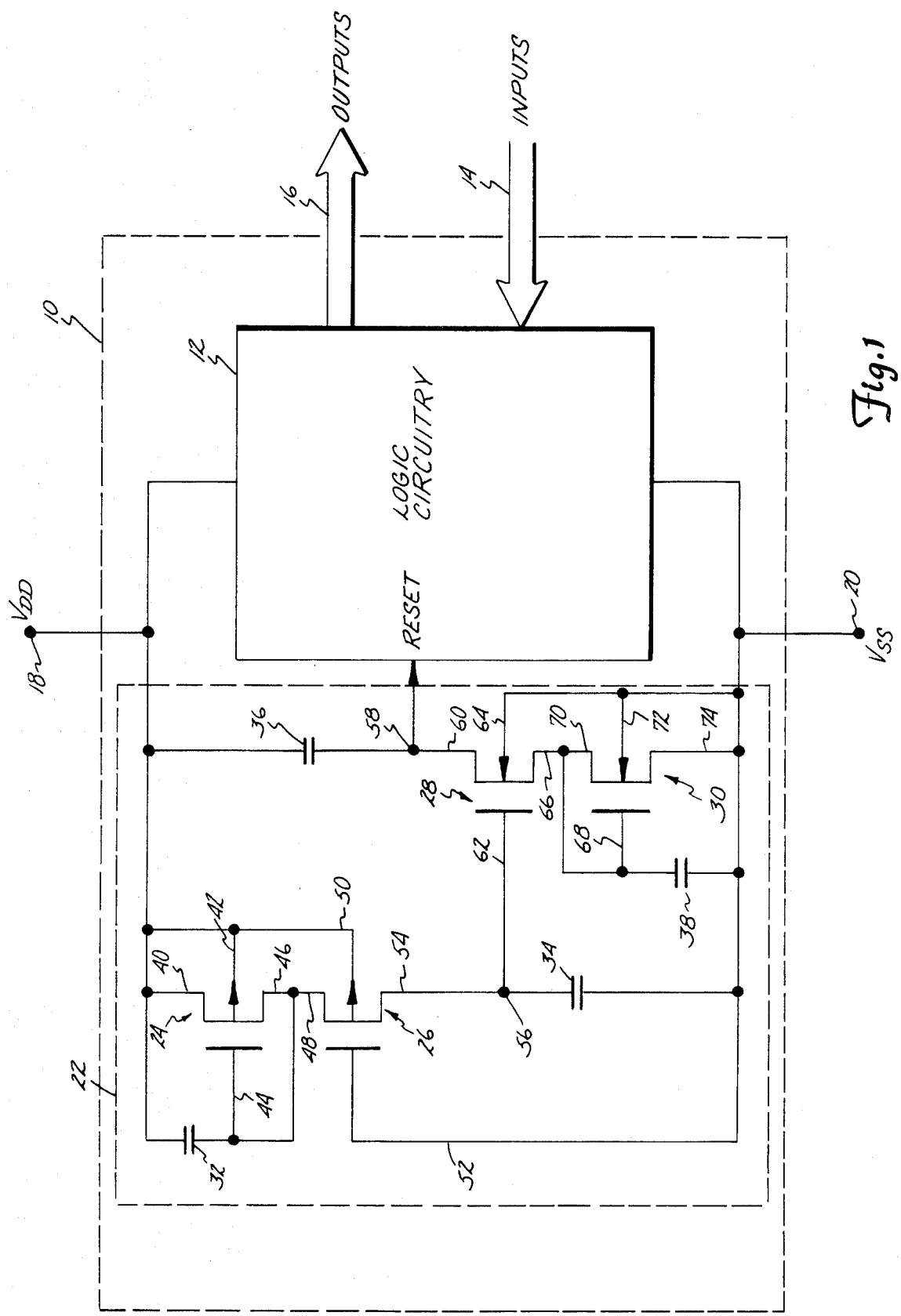
FIG. 1 is an electrical schematic diagram of an integrated circuit which includes the power up reset pulse generator circuit of the present invention.

FIG. 1 shows CMOS integrated circuit 10 which includes circuitry generally designated as logic circuitry 12, inputs 14, outputs 16, power supply terminals 18 and 20, and power up reset pulse generator circuit 22 of the present invention. Logic circuitry 12 is powered by the electrical potential established between power supply terminals 18 and 20 by supply voltages $V_{DD}$ and $V_{SS}$, respectively. When the circuit is at rest (i.e. deenergized), $V_{DD}$ equals $V_{SS}$, and there is no voltage present between power supply terminals 18 and 20 to energize logic circuitry 12.

As power is applied to integrated circuit 10, voltage $V_{DD}$ becomes greater than voltage $V_{SS}$. This establishes a potential difference between power supply terminals 18 and 20 which is used to power logic circuitry 12. The purpose of power up reset pulse generator 22 of the present invention is to produce a reset pulse to logic circuitry 12 which initializes the state of the logic elements within logic circuitry 12 when power is first applied to turn on logic circuitry 12. This may be needed to permit easy testing of the elements within logic circuitry 12, or to place logic circuitry 12 in a known initial state so that further instructions may be supplied through inputs 14 to place logic circuitry 12 into the desired operating condition.

In the preferred embodiment shown in FIG. 1, integrated circuit 10 is a CMOS integrated circuit, and the potential difference between terminals 18 and 20 when power is fully turned on is 5 volts. As will be discussed in detail later, power up reset pulse generator 22 of the present invention is applicable to other FET integrated circuits, and to different voltages.

In the preferred embodiment shown in FIG. 1, power up reset pulse generator 22 includes a pair of P-channel enhancement mode MOS transistors 24 and 26, a pair of N-channel enhancement mode MOS transistors 28 and 30, and MOS capacitors 32, 34, 36 and 38. All circuit elements of power up reset pulse generator 22 are CMOS integrated circuit elements, and power up reset pulse generator 22 is preferably integrated as one portion of integrated circuit chip 10.

Transistors 24 and 26 and capacitor 32 are connected in a first series charging path between power supply terminals 18 and 20. Transistor 24 has its source 40 and its N-type substrate 42 connected to first power supply terminal 18. Gate 44 and drain 46 of transistor 24 are connected together so that transistor 24 acts as a diode. Capacitor 32 is connected between first power supply terminal 18 and gate 44 of first transistor 24.

Gate 44 and drain 46 are connected to source 48 of transistor 26. N-type substrate 50 of transistor 26 is connected to first power supply terminal 18, while gate 52 is connected to second power supply terminal 20. Drain 54 of transistor 26 is connected at node 56 to one terminal of capacitor 34. The opposite terminal of capacitor 34 is connected to second power supply terminal 20.

Capacitor 36 and transistors 28 and 30 are connected in a second series charging path between power supply terminals 18 and 20. Capacitor 36 has one terminal connected to first power supply terminal 18, and its opposite terminal connected at output node 58 to drain 60 of transistor 28. The power up reset pulse generated by reset pulse generator 22 appears at output node 58, and is supplied to logic circuitry 12.

Gate 62 of transistor 28 is connected to node 56, while P-type substrate 64 is connected to second power supply terminal 20. Source 66 of transistor 28 is connected to gate 68 and drain 70 of transistor 30. P-type substrate 72 and source 74 of transistor 30 are connected to second power supply terminal 20. Capacitor 38 is connected between gate 68 of transistor 30 and second power supply terminal 20.

Immediately before power is applied to integrated circuit 10, the voltages across the four capacitors 32, 34, 36 and 38 are all zero, and transistors 24, 26, 28 and 30 are all turned off. Voltage $V_{DD}$ at first power supply terminal 18 and voltage $V_{SS}$ at second power supply terminal 20 are equal. As power is applied to integrated circuit 10, $V_{DD}$ becomes greater than $V_{SS}$. Transistors 24, 26, 28 and 30 initially remain off and thus capacitor 34 causes node 56 to initially follow potential $V_{SS}$, while capacitor 36 causes output node 58 to initially follow potential $V_{DD}$. When $V_{DD}$ minus $V_{SS}$ becomes greater than $|2 V_{TP}|$, where $V_{TP}$ is the P-channel threshold voltage, transistors 24 and 26 turn on and capacitor 34 is permitted to charge through the first series charging path. The time constant of this charging depends upon the parameters of transistors 24 and 26, and the capacitance of capacitor 34, and is selected so that it is longer than the time constant of the power supply turn on which establishes the potential difference between $V_{DD}$ and $V_{SS}$.

As capacitor 34 begins to be charged, the potential at node 56 begins to rise with respect to $V_{SS}$. Eventually node 56 will rise to a potential approximately equal to $V_{DD}$ minus $|V_{TP}|$ with respect to second power supply terminal 20.

When the potential at node 56 exceeds $2 V_{TN}$, where $V_{TN}$ is the N-channel threshold voltage, transistors 28 and 30 turn on and allow capacitor 36 to charge through the second series charging path. As capacitor 36 begins to charge, the potential at output node 58 reoves from $V_{DD}$ to approximately $V_{TN}$ with a time constant which depends upon the parameters of transistors 28 and 30 and the capacitance of capacitor 36. For output node 58 to switch from $V_{DD}$ to $V_{TN}$, therefore, the condition $(V_{DD} - V_{SS}) \geq (2 V_{TN} + |V_{TP}|)$ must be satisified.

Capacitors 32 and 38 perform two important functions in the embodiment of power up reset generator 22 shown in FIG. 1. First, capacitors 32 and 38 ensure that transistors 24 and 30 are initially turned off when power is turned on. This in turn ensures that transistors 26 and 28 are initially turned off.

Second, capacitor 32 provides a time delay to the turn-on of transistor 24, and capacitor 38 provides a time delay to the turn-on of transistor 30. This provides power up reset pulse generator 22 with noise immunity, so that a reset pulse is not supplied to logic circuitry 12 in response to noise produced between power supply terminals 18 and 20.

The purpose of transistors 24 and 30 in FIG. 1 is to double the threshold voltage required to begin charging of capacitors 34 and 36, respectively. As mentioned above, the circuit shown in FIG. 1 is for an integrated circuit 10 in which the difference between $V_{DD}$ and $V_{SS}$ with power on is 5 volts. For integrated circuits having a larger voltage difference during power on, additional transistors connected as diodes can be added in the first and second series charging paths to increase the voltage levels required to begin charging of capacitors 34 and 36, and thus ensure that the reset pulse will be of sufficient duration.

Conversely, if the potential difference between $V_{DD}$ and $V_{SS}$ with power on is less than 5 volts, transistors 24 and 30 and capacitors 32 and 38 may not be needed in order to provide the desired reset pulse width. For an operating CMOS circuit, the potential difference between $V_{DD}$ and $V_{SS}$ with power on should be at least $V_{TN}$ plus $|V_{TP}|$ so that the turn on condition provides adequate safety margin.

Figure 2:
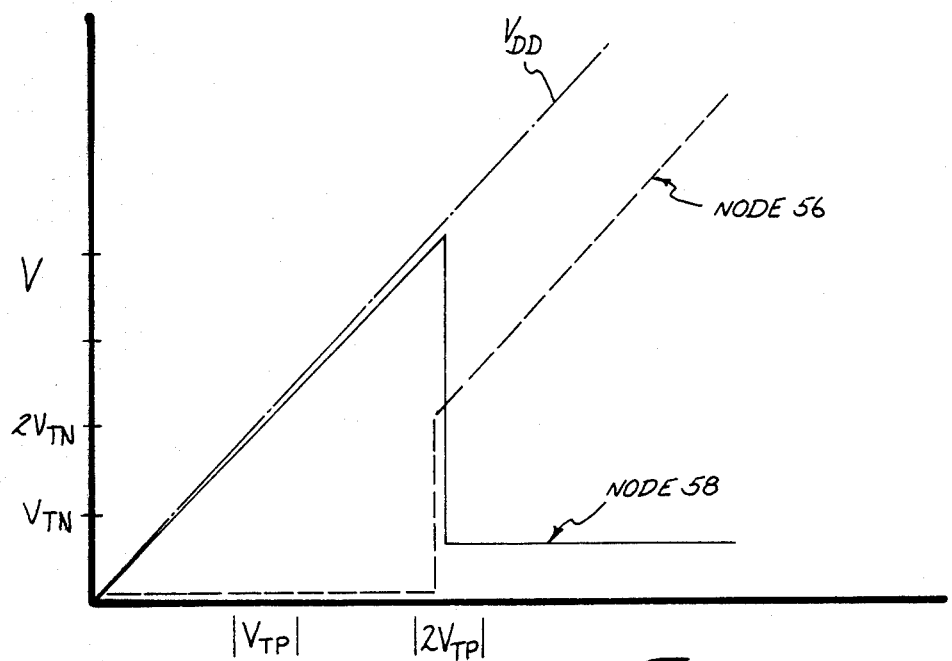
FIG. 2 is a graph of node voltages and supply voltage $V_{DD}$ as a function of supply voltage $V_{DD}$ for the power up reset pulse generator circuit of FIG. 1.
Figure 3:
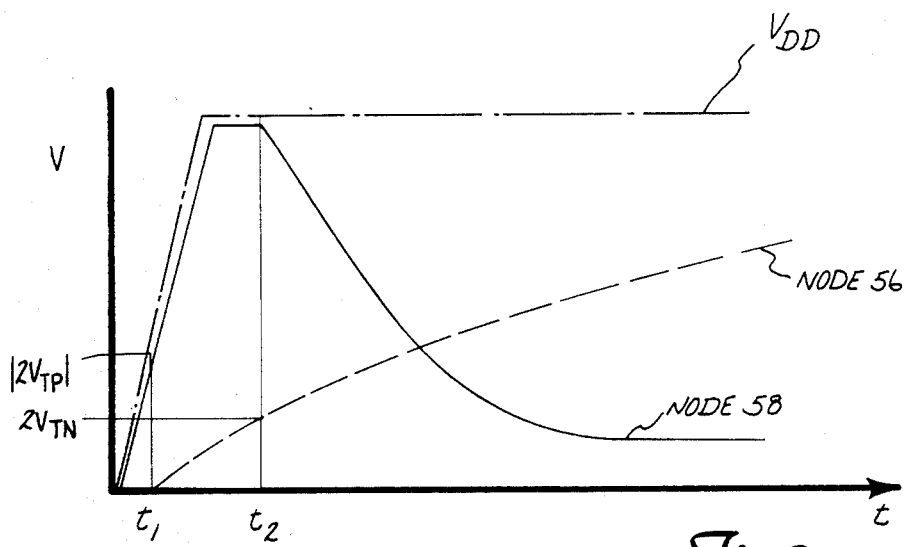
FIG. 3 is a graph showing node voltages and supply voltage $V_{DD}$ as a function of time when power is first applied, illustrating the producing of the reset pulse by the power up reset pulse generator of FIG. 1.

FIGS. 2 and 3 illustrate further the relationship between the voltages at nodes 56 and 58 and potential $V_{DD}$ at first power supply terminal 18. In FIGS. 2 and 3, all voltages are shown with respect to second power supply terminal 20 (i.e. as if $V_{SS}$ equals zero).

FIG. 2 is a chart of DC voltages as a function of potential $V_{DD}$. As illustrated in FIG. 2, the potential at node 56 is essentially zero (i.e. equal to $V_{SS}$) as long as $V_{DD}$ is less than $|2 V_{TP}|$. This corresponds to the turn-on threshold of transistors 24 and 26. For values of $V_{DD}$ greater than $|2 V_{TP}|$, the voltage at node 56 is allowed to follow $V_{DD}$ less the threshold voltages of transistors 24 and 26.

The voltage at output node 58 is essentially equal to $V_{DD}$, unless the voltage at node 56 exceeds $2 V_{TN}$. For higher values of $V_{DD}$, output node 58 is within about one-half threshold voltage of zero (i.e. $V_{SS}$).

The relationships shown in FIG. 2 are DC relationships, which do not take into account the time relationships between the voltages at nodes 56 and 58 and potential $V_{DD}$. These time relationships are illustrated in FIG. 3.

As shown in FIG. 3, as power is first turned on, $V_{DD}$ rises rapidly to its maximum value (in this case 5 volts). The voltage at output node 58 follows $V_{DD}$ up to its maximum value, and initially remains at that maximum value. As $V_{DD}$ initially ries and exceeds $|2 V_{TP}|$, (at time $t_1$), transistors 24 and 26 turn on, allowing capacitor 34 to charge. Starting at time $t_1$, the voltage at node 56 begins to rise as shown in FIG. 3 with a time constant determined by the current flow through transistors 24 and 26 and the capacitance of capacitor 34. When the voltage at node 56 reaches $2 V_{TN}$ (at time $t_2$), transistors 28 and 30 turn on, and capacitor 36 begins to charge. This produces the trailing edge of the reset pulse at node 58 shown in FIG. 3. The decay of the reset pulse at output node 58 has a time constant which is determined by the current flow through transistors 28 and 30 and the capacitance of capacitor 36.

After the initial reset pulse is produced by power up reset pulse generator 22, capacitors 34 and 36 continue to charge until each has a voltage which is approximately equal to $V_{DD}$ minus $V_{SS}$ less approximately one-half a threshold voltage. The voltage across transistors 24 and 26 is minimal, since they are no longer conducting any current. Similarly, the voltage across transistors 28 and 30 is minimal because they ae no longer conducting. As a result, the power up reset pulse generator 22 shown in FIG. 1 consumes no static or standby power while integrated circuit 10 is in its normal operation. This is an important feature of the present invention, since low power consumption is an important criteria for CMOS and other low power FET integrated circuits. The reset pulse generator 22 of the present invention preferably uses both P-channel and N-channel transistors so that the switching point depends upon both the P-channel and N-channel threshold voltages. As a result, the characteristics of reset pulse generator 22 match the characteristics of the remaining logic circuitry 12 of integrated circuit 10. As threshold voltages $V_{TN}$ and $V_{TP}$ of logic circuitry 12 vary due to processing, the switching point of power up reset pulse generator 22 similarly varies.

Another important advantage of the present invention is that it is capable of operating with slow, fast, and bouncing power supply transistions. This allows the reset pulse generator to be used in a variety of applications.

In conclusion, the present invention is a highly advantageous, simple and fully integrable power up reset pulse generator for use in field effect transistor integrated circuits. Although the specific embodiment shown is that of a CMOS integrated circuit, the present invention is applicable to other FET integrated circuits as well, such as JFET integrated circuits.

Although the present invention has been described with reference to preferred embodiments, workers skilled in the art will recognize that changes may be made in form and detail without departing from the spirit and scope of the invention.

What is claimed is:

1. A power up reset pulse generator for producing a reset pulse at an output in response to voltage being applied between first and second power supply terminals of an integrated circuit of a magnitude greater than a first threshold value after the applied voltage being less than this value, where the first and second power supply terminals are for connection to first and second voltage supplies, the power up reset pulse generator comprising:

first capacitor means;

first series FET means for controlling charging of the first capacitor means at a function of the voltage between the first and second power supply terminals, the first series FET means being connected in series with the first capacitor means in a first series charging path between the first and second power supply terminals, with the first series FET means comprising:

a first delay capacitor means, and a plurality of FET devices, including a control FET and a first threshold addition FET each having a source, a drain, and a gate, such that the first threshold addition FET source is electrically connected to the first power supply terminal with the first threshold addition FET gate and drain electrically connected together to place the first threshold addition FET in the first series charging path, with the first delay capacitor means electrically connected between the first power supply terminal and the first threshold addition FET gate, and with the control FET source and drain electrically connected to place the control FET in the first series charging path leaving the control FET gate responsive to the voltage between the first and second power supply terminals to permit charging of the first capacitor means to establish a voltage across the first capacitor means when the voltage between the first and second power supply terminals exceeds a first predetermined level;

second capacitor means connected between the first power supply terminal and the output; and second FET series means for controlling charging of the second capacitor means as a function of the voltage across the first capacitor means, the second FET series means being connected in series with the second capacitor means in a second series charging path between the first and second power supply terminals, and the second FET series means being responsive to the voltage across the first capacitor means to permit charging of the second capacitor means when the voltage across the first capacitor means exceeds a second predetermined level, whereby if voltage is applied between the first and second power supply terminal greater than the threshold value, the voltage at the output with respect to the second power supply terminal follows the first power supply terminal voltage until increasing voltage across the first capacitor means reaches the second predetermined level which causes the second FET means to permit charging of the second capacitor means such that the voltage at the output approaches the second power supply terminal voltage.

2. The power up reset pulse generator of claim 1 wherein the first threshold addition FET and the control FET is each an enhancement mode FET; and wherein the second series FET means includes a controlled FET which is an enhancement mode FET having a gate, a source, and a drain which source and drain are connected in the second series charging path leaving the gate electrically connected so that voltage between the gate and the controlled FET source is responsive to the voltage across the first capacitor means.

3. The power up reset pulse generator of claim 2 wherein the control FET source is electrically connected in the first series charging path between the first power supply terminal and a first node, and wherein the first capacitor means is connected between the first node and the second power supply terminal.

4. The power up reset pulse generator of claim 3 wherein the control FET drain is electrically connected to the first node.

5. The power up reset pulse generator of claim 3 wherein the first threshold addition FET and the control FET is each a P-channel enhancement mode MOS space FET.

6. The power up reset pulse generator of claim 3 wherein the control FET gate is electrically connected to the second power supply terminal.

7. The power up reset pulse generator of claim 3 wherein the controlled FET source and drain are connected in the second series charging path between the output and the second power supply terminal.

8. The power up reset pulse generator of claim 7 wherein the controlled FET gate is electrically connected to the first node.

9. The power up reset pulse generator of claim 3 wherein the second series FET means further includes a second threshold addition FET having a gate, a source and a drain, the second threshold addition FET source and drain being connected in series with the source and drain of the controlled FET between the output and the second power supply terminal, and the second threshold addition FET gate and drain being electrically connected together.

10. The power up reset pulse generator of claim 9 and further comprising a second delay capacitor means connected between the second power supply terminal and the second threshold addition FET drain.

11. The power up reset pulse generator of claim 10 wherein the controlled FET drain is electrically connected to the output and the second threshold addition FET source is electrically connected to the second power supply terminal.

12. The power up reset pulse generator of claim 11 wherein the second threshold addition FET and the controlled FET are each an N-channel enhancement mode MOS FET.

13. The power up reset pulse generator of claim 12 wherein the integrated circuit is a CMOS integrated circuit, and wherein the first and second capacitor means are integrated MOS capacitors and the control FET and controlled FET are each a MOS FET.

* * * * *